United States Patent
Boglione

(10) Patent No.: US 9,500,688 B2
(45) Date of Patent: Nov. 22, 2016

(54) NOISE TEMPERATURE EXTRACTION PROCEDURE FOR CHARACTERIZATION OF ON-WAFER DEVICES

(71) Applicant: Luciano Boglione, Cambridge, MA (US)

(72) Inventor: Luciano Boglione, Cambridge, MA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 645 days.

(21) Appl. No.: 14/031,373

(22) Filed: Sep. 19, 2013

(65) Prior Publication Data
US 2014/0081586 A1    Mar. 20, 2014

Related U.S. Application Data

(60) Provisional application No. 61/703,384, filed on Sep. 20, 2012.

(51) Int. Cl.
*G01R 29/26* (2006.01)
*G01R 31/26* (2014.01)

(52) U.S. Cl.
CPC ........... *G01R 29/26* (2013.01); *G01R 31/2626* (2013.01)

(58) Field of Classification Search
CPC .................... G01R 31/2626; G01R 29/26
See application file for complete search history.

(56) References Cited

U.S. PATENT DOCUMENTS

2009/0216480 A1* 8/2009 Kuo ............... G01R 31/2822
  702/118
2009/0224772 A1* 9/2009 Jagannathan ....... G01R 35/00
  324/601

(Continued)

OTHER PUBLICATIONS

H. Hillbrand and P. H. Russer, "An efficient method for computer aided noise analysis of linear amplifier networks," IEEE Trans. on Circuits and Systems, vol. CAS-23, No. 4, pp. 235-238, Apr. 1976.

(Continued)

*Primary Examiner* — Toan Le
*Assistant Examiner* — Eyob Hagos
(74) *Attorney, Agent, or Firm* — US Naval Research Laboratory; Joslyn Baritt

(57) ABSTRACT

A procedure for obtaining noise temperatures of a field effect transistor (FET) embedded on a wafer through an analytical procedure which processes measured noise figure data over transistor's size $P_d$ within a frequency range at constant voltage and current density. The parasitic elements associated with an electrical model of the embedding structures are determined. Then, for each of n=1, 2, . . . N FETs, the scattering parameters and noise figure $F_{meas,n}$ are measured, the components of the core model, normalized to the periphery $P_d$ are determined, and the noise contributions of the parasitic components are de-embedded from $F_{meas,n}$. The noise temperatures $t_{gs}$, $t_{ds}$, and $t_{gd}$ are found by solving the equation $$\frac{4N_i G_s(F_{meas,n}-1) - y_s^+ C_{T_A} y_s - y_s^+ T_{B,n} T_A C_{T_C} T_A^+ T_{B,n}^+ y_s}{P_{d_n}} =$$

$$A_n t_{ds} + B_n t_{gs} + C_n t_{gd}$$

using at least three values of $F_{meas,n}$ and $P_{d,n}$. Finally, the noise temperatures $T_{gs}$, $T_{ds}$, and $T_{gd}$ are found, where $T_{gs}=t_{gs}*T_0$, $T_0=290K$; $T_{ds}=t_{ds}*T_0$; and $T_{gd}=t_{gd}*T_0$.

2 Claims, 5 Drawing Sheets

(56) References Cited

U.S. PATENT DOCUMENTS

| | | | | |
|---|---|---|---|---|
| 2010/0030504 A1* | 2/2010 | Simpson | ............... | G01R 27/02 702/69 |
| 2011/0238383 A1* | 9/2011 | Metzger | ............... | G01R 27/04 702/196 |
| 2013/0063213 A1* | 3/2013 | Kobayashi | ............. | H03F 3/189 330/291 |
| 2016/0099683 A1* | 4/2016 | Sen | ...................... | H03F 1/0205 330/296 |

OTHER PUBLICATIONS

H. T. Friis, "Noise Figures of Radio Receivers," Proc. IRE, vol. 32, pp. 419-422, Jul. 1944.

R. Q. Lane, "The determination of device noise parameters," Proc. IEEE, vol. 57, pp. 1461-1462, Aug. 1969.

L. Boglione, "An original demonstration of the $T_{min}/T0 \leq N$ inequality for noisy two-port networks," IEEE Microwave and Wireless Components Letters, vol. 18, No. 5, pp. 326-328, May 2008.

P. J. Tasker, W. Reinert, B. Hughes, J. Braunstein, and M. Schlechtweg, "Transistor noise parameter extraction using a 50 ohm measurement system," IEEE MTTS International Microwave Symposium Digest, pp. 1251-1254, Atlanta, 1993.

M. W. Pospieszalski, "Modelling of noise parameters of MESFET's and MODFET's and their frequency and temperature dependence," IEEE Trans. on Microwave Theory and Techniques, vol. 37, No. 9, pp. 1340-1350, Sep. 1989.

L. Boglione, R. D. Pollard, and V. Postoyalko, "The Pospieszalski noise model and the imaginary part of the optimum noise source impedance of extrinsic or packaged FETs," IEEE Microwave and Guided Wave Letters, vol. 7, No. 9, pp. 270-272, Sep. 1997.

M. W. Pospieszalski, "Interpreting transistor noise," Microwave Magazine, IEEE, vol. 11, No. 6, pp. 61-69, Oct. 2010.

B. Hughes, "A temperature noise model for extrinsic FET's," IEEE Trans. on Microwave Theory and Techniques, vol. 40, No. 9, pp. 1821-1831, Sep. 1992.

H. Nyquist, "Thermal Agitation of Electric Charge in Conductors," Physical Review, vol. 32, Jul. 1928, pp. 110-113.

D. Pozar, Microwave Engineering, 4th Ed. (2012), p. 506.

Boglione, L., R. D. Pollard, V. Postoyalko, and T. Alam, "Specifications for a linear network simultaneously noise and available-power matched," Microwave and Guided Wave Letters, IEEE, vol. 6, No. 11, pp. 407-409, Nov. 1996.

L. Boglione, "A novel extraction procedure to determine the noise parameters of on-wafer devices," International Microwave Symposium, Seattle WA, Jun. 2-7, 2013.

L.Boglione, "A noise parameters extraction procedure suitable for on-wafer device characterization," Semiconductor Conference Dresden-Grenoble (ISCDG), 2012 International (Sep. 24-26, 2012), pp. 135-138.

* cited by examiner

NOISE TEMPERATURE EXTRACTION PROCEDURE FOR CHARACTERIZATION OF ON-WAFER DEVICES

CROSS-REFERENCE

This application is a Nonprovisional of, and claims the benefit of priority under 35 U.S.C. §119 based on, U.S. Provisional Patent Application No. 61/703,384 filed on Sep. 20, 2012, the entirety of which is hereby incorporated by reference into the present application.

TECHNICAL FIELD

The present invention relates to microwave networks, more particularly to characterization of the noise performance of an on-wafer device through determination of the device's noise temperatures via measurement of its noise figure.

BACKGROUND

A random variation in the flow of carriers manifests itself as electrical noise. Noise is present in many forms. A common feature among the various forms of noise is that the power associated with these random variations is small. Noise is of particular importance when the electrical network deals with small signals: this is the typical case for radio receivers whose fundamental task is to amplify the information carried by a weak incoming signal without degrading it with its own internally generated noise. The amplification function is typically provided by transistors: the circuit within which the transistor operates defines the microwave network under consideration. Due to the small powers carried by either the signal or the noise, linearity is assumed.

The noise parameters are 4 real numbers that are used to fully characterize the noise performance of a field effect transistor (FET) serving as a 2-port microwave network at a given frequency of operation. Noise parameters are of particular importance to characterize and compare transistors since they are at the core of the design of microwave amplifiers and other networks for low noise applications. Therefore, facilitating the determination of the noise parameters from measurement will benefit both transistor manufacturers and circuit designers for microwave applications.

The set of noise parameters is not unique, since it depends on the type of representation in use to describe the FET. For instance, the noise parameters in Z or T (ABCD) representations are different, yet equivalent since they represent the same device. It is common practice in both industry and research institutions to represent the noise parameters with the minimum noise figure $F_{min}$, usually reported in dB; the real and imaginary part of the optimum noise reflection coefficient $\Gamma_{Sopt}$; and the equivalent noise resistance $R_n$.

A FET processing a small signal can be described in the frequency domain by a linear relationship between input and output current ($I_1$; $I_2$) and voltages ($V_1$; $V_2$), or a linear combination of these quantities. See H. Hillbrand and P. H. Russer, "An efficient method for computer aided noise analysis of linear amplifier networks," IEEE Trans. on Circuits and Systems, Vol. CAS-23, No. 4, pp. 235-238, April 1976. For instance, the T or (ABCD) representation can be described by $$\begin{bmatrix} V_1 \\ I_1 \end{bmatrix} = T * \begin{bmatrix} V_1 \\ -I_2 \end{bmatrix} + \begin{bmatrix} v_n \\ i_n \end{bmatrix} \leftrightarrow y = T*x + n_T \quad (1)$$

where the minus sign refers to the fact that currents are conventionally considered flowing into the device, T is the device's transmission matrix, and x is the vector $$\begin{bmatrix} V_1 \\ -I_2 \end{bmatrix},$$

and where the voltage and current noise sources $v_n$ and $i_n$, respectively, of the device in that representation are arranged in a vector $n_T$ in order to make use of matrix algebra.

The vector $n_T$ and its hermitian (i.e. conjugate transpose) $n_T^+$ define the correlation matrix $C_T$:

$$C_T = n_T n_T^+ = 4N_i \begin{bmatrix} R_n & \rho_0^* \\ \rho_0 & g_n \end{bmatrix}, \quad (2)$$

where + is the hermitian operation, $N_i = kT_0 B$ where B is the bandwidth within which $N_i$ is considered, $R_n$ is the equivalent noise resistance, and $g_n$ is the equivalent noise conductance. The terms in Equation (2) are all defined in the frequency domain, with the diagonal terms representing the average values of the network's respective noise sources and the off-diagonal terms referring to the correlation between the noise sources.

This correlation matrix uniquely describes the noise performance of the network, and its elements are the noise parameters of the network. These elements can be linked to a measurable quantity known as the "noise figure" F, which measures the deterioration of the signal-to-noise ratio as a signal flows through the noisy network. See H. T. Friis, "Noise Figures of Radio Receivers," Proc. IRE, Vol. 32, pp. 419-422, July 1944. The noise figure is a dimensionless quantity, usually reported in dB, and is defined within a narrow bandwidth B around the frequency of operation $f_0$ and is dependent on the source admittance $Y_S = G_S + jB_S$, i.e., the output admittance of the equivalent small signal network representation of the source at $f_0$.

Hillibrand, supra, provides an expression of the form $$F(Y_s) = 1 + \frac{y_s^+ C_{T_{meas}} y_s}{4N_i G_s} \quad (3a)$$

where $$y_s^+ = [Y_s \quad 1] \quad (3b)$$

to evaluate the noise figure of a noisy network as a function of the source admittance $Y_S$. Using mathematical operations known in the art, Equations (3a) and (3b) can be transformed into the standard expression for noise figure:

$$F(Y_S) = F_{min} + R_n \frac{|Y_S - Y_{Sopt}|^2}{G_s} \quad (4)$$

where $G_S$ is the conductance of the known source admittance $Y_S$, i.e., real($Y_S$)=$G_S$, $F_{min}$ is the minimum noise figure, $R_n$ is the equivalent noise resistance, and the complex value $Y_{Sopt}$ is the source's admittance at the frequency $f_0$. $F_{min}$, $R_n$ and $Y_{Sopt}$ are the noise parameters.

Equation (4) is the basis of the standard measurement of the noise parameters of a two-port microwave network, and highlights the dependence of the noise figure F on the noise source admittance $Y_S$. For example, if $Y_S=(1/50[\Omega])=0.02$ [S], then Equation (4) produces the noise figure $F(Y_S)=F_{50}$ well known in the art. Alternatively, if the noise figure $F(Y_S)$ is measured for at least four different source admittance values $Y_S$, Equation (4) can be solved for $F_{min}$, $R_n$, $G_{Sopt}$ and $B_{Sopt}$ where $Y_{Sopt}=G_{Sopt}+jB_{Sopt}$. A least squares method has become the standard method for extracting the noise parameters from the measurement of noise figure versus source admittance where more than 4 measurements are made. See R. Q. Lane, "The determination of device noise parameters," Proc. IEEE, Vol. 57, pp. 1461-1462, August 1969.

A major deficiency of this standard method, however, is that the measurement setup must be able to present four or more distinct source admittance values $Y_S$ to the device under test (DUT). This key requirement calls for the use of a microwave tuner, which imposes a constraint on the usable frequency range of the setup.

In addition, the measurement uncertainties associated with this procedure often generates noise parameter values that may not be acceptable, and it is not possible to decide a priori whether a given set of measured pairs (F, $Y_S$) will generate acceptable noise parameters. It has been demonstrated that $$\frac{4NT_0}{T_{min}} \geq 1, \quad (5)$$

where N is the Lange parameter and $T_{min}=T_0*(F-1)$ is the minimum noise temperature. This inequality is a validity test that can be used during measurement sessions or when reviewing data sheets of commercially available devices and must be verified for the noise parameters presented therein to be acceptable. See L. Boglione, "An original demonstration of the $T_{min}/T_0 \leq 4N$ inequality for noisy two-port networks," IEEE Microwave and Wireless Components Letters, Vol. 18, No. 5, pp. 326-328, May 2008.

An alternative method for determining the noise parameters was developed by P. J. Tasker et al. See P. J. Tasker, W. Reinert, B. Hughes, J. Braunstein, and M. Schlechtweg, "Transistor noise parameter extraction using a 50 ohm measurement system," IEEE MTT S International Microwave Symposium Digest, pp. 1251-1254, Atlanta, 1993. The Tasker method is based on the Pospieszalski model, a simple and popular noise model which characterizes the noise performance of a network through evaluation of its "equivalent noise temperatures." The idea behind the use of equivalent noise temperatures is the concept that a noise source can be associated with an equivalent temperature through the standard relationship with power: P=kTB. The power P in a frequency bandwidth B is equivalent to the temperature T. The Pospieszalski model makes use of two resistors, $R_{GS}$ and $R_{DS}$, which generate uncorrelated noise power; their respective noise powers are represented by their equivalent noise temperatures $T_{gs}$ and $T_{ds}$. The Pospieszalski noise model has been validated with many types of device, both on-wafer and packaged. See M. W. Pospieszalski, "Modelling of noise parameters of MESFET's and MODFET's and their frequency and temperature dependence," IEEE Trans. on Microwave Theory and Techniques, Vol. 37, No. 9, pp. 1340-1350, September 1989; L. Boglione, R. D. Pollard, and V. Postoyalko, "The Pospieszalski noise model and the imaginary part of the optimum noise source impedance of extrinsic or packaged FETs," IEEE Microwave And Guided Wave Letters, Vol. 7, No. 9, pp. 270-272, September 1997; and M. W. Pospieszalski, "Interpreting transistor noise," Microwave Magazine, IEEE, Vol. 11, No. 6, pp. 61-69, October 2010; see also B. Hughes, "A temperature noise model for extrinsic FET's," IEEE Trans. on Microwave Theory and Techniques, Vol. 40, No. 9, pp. 1821-1831, September 1992.

The Tasker approach takes advantage of the experimental observation that $T_{gs}$, the noise temperature of the Pospieszalski noise model between the source and the gate, approaches the expected value $T_0 \approx 290K$ at room temperature. The standard value $Y_S=1/50[\Omega]=20[mS]$ is used during noise figure measurement since microwave instrumentation is generally matched to $50[\Omega]$. Therefore, one measurement of the noise figure for a single source admittance $Y_S$ at the operation frequency is sufficient to determine the single unknown $T_d$, because the noise sources represented by $T_{gs}$ and $T_{ds}$ are uncorrelated according to the Pospieszalski model. The removal of the source tuner from the setup has raised interest in the community. However, in the Tasker method, the noise temperature $T_{ds}$ is not obtained analytically from the measurement data, but instead is obtained by an optimization procedure based on the use of a standard circuit simulator software in which the software user determines the equivalent noise temperature $T_{ds}$ by varying its value, simulating the noise figure of the transistor model, and comparing it against the measured noise figure. In practice, the noise temperature $T_{gs}$ is also varied around the expected value $T_0$ in order to optimize the simulated noise figure against its measurement.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a new extraction procedure for obtaining the noise temperatures of an on-wafer device acting as a microwave network, specifically a transistor such as a field effect transistor (FET).

The FET is embedded on a wafer and can be described using an electrical model which scales with the transistor size, or device periphery, $P_d$. The FET is accessible through a pair of pads and corresponding access lines or other structures. As described herein, the FET is referred to as network element B, the two pad/access line pairs are referred to as network elements A and C, and the entire network is referred to as "chain network ABC."

The extraction of the noise temperatures of a FET in accordance with the present invention is based on an analytical procedure which processes measured noise figure data over transistor's size $P_d$ within a frequency range at constant voltage and current density using a method which includes the following steps:

1. Using a suitable instrument such as a network analyzer, determine the parasitic elements associated with a suitable electrical model of the on-wafer structures comprising network elements A and C embedding the transistor (network element B) by measuring equivalent structures fabricated on the same wafer. This step of determining the values of the values of the parasitic elements includes: (a) calibrating the network analyzer up to the probe tips; (b) measuring the scattering parameters of the on-wafer structures with the calibrated network analyzer and storing the result in a data file; (c) applying standard mathematical transformations to transform the measured data from scattering S to admittance Y parameters; (d) using the resulting Y parameters to determine the pad contribution; (e) subtracting the pad contribution from the Y parameter; (f) transforming the result to Z parameters to determine the contribution of the access line; and (g) verifying the result against the measured data to confirm the models representing the networks.

2. For every frequency of interest and for each of n=1, 2, . . . , N chain networks ABC, each having a corresponding $n^{th}$ network element B comprising an $n^{th}$ transistor device having a corresponding device size $P_{d,n}$, each network element B being represented by the same circuit topology, all of the N transistor devices being biased at the same voltage $V_{DS}$ and current density $J_{DS}$, (a) Measure the scattering parameters of the on-wafer FET with the calibrated network analyzer;
   (b) Measure the on-wafer FET's noise figure $F_{meas,n}$ associated with a source admittance $Y_S$ with standard noise figure measurement equipment. A 50Ω reference impedance is typical of microwave instruments, and in such a case $Y_S=(1/50)=20$ [mS] and $F_{meas,n}$ is a standard noise figure commonly referred to in the art as $F_{50}$. However, the actual value of the source admittance $Y_S$ is determined during calibration of the setup and so it may vary from the nominal value.

3. Determine the components of the core model, normalized to the periphery $P_d$: $\hat{r}_{gs}, \hat{r}_{ds}, \hat{r}_{gd}$ (in [Ω*mm]); $\hat{c}_{gs}, \hat{c}_{ds}, \hat{c}_{gd}$ (in [pF/mm]); $|\hat{g}_m|$ (in [mS/mm]); and τ in [ps] through standard transformations of the measured scattering parameters. This step includes (a) retrieving the data of the scattering parameters $S_n$ of the $n^{th}$ FET device represented by the $n^{th}$ network element B; (b) transforming the scattering parameters $S_n$ into chain matrix (ABCD) parameters $T_n$; (c) de-embedding the contributions of network elements A and C from the chain parameters $T_n$ to obtain the chain parameters $T_{FET,n}$ of the embedded transistors; (d) transforming the chain parameters $T_{FET,n}$ into either admittance parameters $Y_{FET,n}$ or impedance parameters $Z_{FET,n}$ to determine the component values of the model according to procedures familiar to a person skilled in the art; and (e) verifying the resulting electrical model against the measured data.

4. De-embed the noise contributions of the parasitic components from the measured noise figure $F_{meas,n}$ obtained in step 2 in order to obtain the noise figure $F_{FET,n}$ of the embedded transistor. Obtaining $F_{FET,n}$ includes (a) measuring the noise figure $F_{meas,n}$ of an embedded transistor having a known size $P_{d,n}$; (b) de-embedding the noise contribution of network elements A and C to obtain the noise figure $F_{FET,n}$ of the transistor (network element B) from the measured noise figure $F_{meas,n}$. Steps (a) and (b) are repeated for each of n=1, 2, . . . N evaluated transistors biased at the same $V_{DS}$ and current density $J_{DS}$ and having varying device sizes $P_{d,n}$, where the size is typically expressed in terms of gate width in [μm] for a constant gate length L [μm].

5. Find the normalized equivalent noise temperatures $t_{gs}$, $t_{ds}$, and $t_{gd}$ of the FET by relating the measured noise figure to the equivalent noise temperatures. Once the values of $t_{gs}$, $t_{ds}$, and $t_{gd}$ are calculated analytically using an appropriately programmed computer, the computer can then easily find the noise temperatures $T_{gs}$, $T_{ds}$, and $T_{gd}$ associated with $\hat{r}_{gs}, \hat{r}_{ds}, \hat{r}_{gd}$, respectively, where $T_{gs}=t_{gs}*T_0$, $T_0=290K$; $T_{ds}=t_{ds}*T_0$; and $T_{gd}=t_{gd}*T_0$.

DETAILED DESCRIPTION

Figure 1:
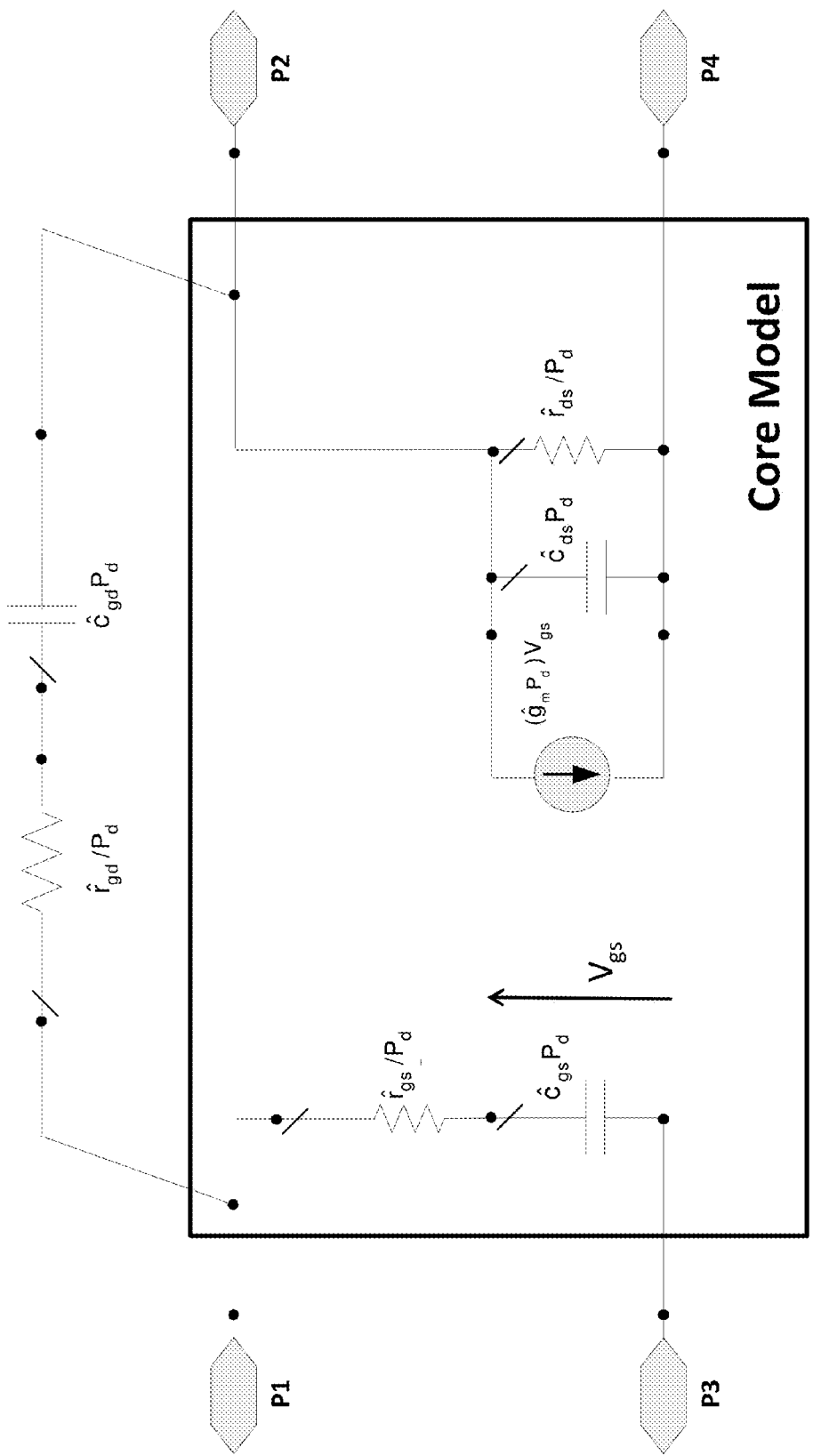
FIG. 1 is a block schematic illustrating aspects of the Pospieszalski noise model in accordance with the prior art.

The aspects and features of the present invention summarized above can be embodied in various forms. The following description shows, by way of illustration, combinations, and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a new extraction procedure for obtaining the noise temperatures $T_{gs}$, $T_{ds}$, and $T_{gd}$ of a particular class of microwave networks consisting of on-wafer microwave field effect transistors (FET). This class of networks can be described by an electrical model that scales with the transistor size. The extraction of the noise temperatures from data in accordance with the present invention is based on an analytical procedure which processes measured data taken over transistor size within a frequency range at constant voltage and current density. Once the noise temperatures are found, the noise parameters of the device can be calculated and the noise performance of a circuit based on the same device, possibly of different size, biased at the same drain voltage and current density can be determined by computer assisted design software.

As will be appreciated by one skilled in the art, a method for finding such noise temperatures in accordance with the present invention can be accomplished by executing one or more sequences of instructions contained in computer-readable program code read into a memory of one or more appropriately programmed general or special-purpose computers configured to execute the instructions.

A microwave network may have more than two physical ports if DC and RF ports are taken into account; for instance, microwave networks dedicated to the amplification of incoming signals are considered to be two-port networks: the input port receives the incoming signal; the output ports delivers the outgoing signal to a load or a subsequent network. The incoming signal also comprises noise generated by the preceding stages and gets amplified by the microwave network since it is indistinguishable by the network from any other man-made signal. The outgoing signal ideally is an amplified replica of the incoming signal, where the signal may include a noisy component regardless of its amplitude. However, the smaller the amplitude of the incoming signal, the more difficult to distinguish the signal from the electrical noise generated within the transistor and delivered to the output load.

The measured noise figure $F_{meas}$ is a measurement defined between any two ports of interest of a microwave network (e.g. the input and output port) and quantifies the degradation of the incoming signal-to-noise ratio due to the additional noise caused by the microwave network. The closer the noise figure to the value 1, the smaller the amplifier's noise contribution.

The present invention provides a computer-implemented method for evaluating the noise of a two-port microwave network. The method is based on a standard, scalable electrical model—the Pospieszalski noise model that can describe both signal and noise performance of FET devices. The model is based on the assumption that the noise sources of the device are associated with the $R_{ds}$, $R_{gs}$ and $R_{gd}$ resistances between the drain and the source, the gate and the source, and the gate and the drain, respectively, with each resistance being associated with a noise source. The noise sources generate an available noise power that is independent of the resistance values according to the equation $P_x = kT_x B$, where x=gs, gd, ds, k is the Boltzmann constant and B is the bandwidth of interest. The noise source is associated with the resistances through a Thevenin or Norton equivalent circuit, where the voltage or current source is calculated to deliver the available power $P_x$. See H. Nyquist, "Thermal Agitation of Electric Charge in Conductors," Physical Review, Vol. 32, July, 1928, pp. 110-113. The method of the present invention analytically determines the noise temperature $T_x$ associated with the resistance $R_x = \hat{r}_x P_d$ where $P_d$ is the size (gate width) of the device.

A method for evaluating the noise of a microwave network in accordance with the present invention has several advantages over that of the prior art. One advantage is that it relies on analytical calculations to determine the transistor's equivalent noise temperatures $T_{gs}$, $T_{ds}$, and $T_{gd}$. Another major advantage is that it is based on the measurement of the noise figure at a constant admittance of source $Y_S$ without the use of an external tuner. Finally, the method of the present invention is data-driven, and does not make a priori assumptions about the noise temperatures of the FET's internal noise sources. In addition, the method of the present invention enables the determination of the equivalent noise temperatures of all the lossy components of a transistor model, i.e., values of the noise temperatures $T_{gs}$, $T_{ds}$, and $T_{gd}$ associated with $\hat{r}_{gs}$, $\hat{r}_{ds}$, and $\hat{r}_{gd}$. The method of the present invention does not make a priori assumptions about their values and is able to calculate, rather than optimize, the model's equivalent noise temperatures.

The present invention utilizes the fact that on-chip devices can be described by a model whose components scale proportionally to $P_d$, the size of the device, but the noise temperatures are independent of the size $P_d$ of the device. In the method of the present invention, the size $P_d$ of the device is varied in the measurement of the noise figure F, rather than the source admittance $Y_S$. Thus, instead of measuring the noise figure F over a frequency range as a function of a set of known source admittance $Y_S$ values at each frequency point, in the method of the present invention, the noise figure is collected for n=1, 2, . . . , N devices each having a different device periphery $P_d$, with $Y_S$ being a known value at each measurement frequency. Because $Y_S$ is not required to change as part of the procedure, no external tuner is required and the bandwidth constraint imposed by the tuner on the measurement setup is removed.

FIG. 1 is a block schematic illustrating aspects of the Pospieszalski noise model described in the prior art.

As illustrated in FIG. 1, the Pospieszalski noise model of a device of size $P_d$ includes 6 lumped components (3 resistances, $\hat{r}_{gs}/P_d$, $\hat{r}_{ds}/P_d$, $\hat{r}_{gd}/P_d$, and 3 capacitors, $\hat{c}_{gs}P_d$, $\hat{c}_{ds}P_d$, $\hat{c}_{gd}P_d$) along with a current source. The current source is proportional to the voltage across the capacitor $\hat{c}_{gs}P_d$, where the coefficient of proportionality is a complex parameter $\hat{g}_m = \hat{G}_m e^{-j\omega\tau}$, where $\hat{G}_m$ is the magnitude of $\hat{g}_m$. Overall, the model consists of 8 real values which are constant over the frequency range of interest. The model is accessed through 4 nodes, indicated by P1-P4. External voltages and currents interact with the model at these nodes. The set of nodes P1 and P3 constitutes the input port, while the set of nodes P2 and P4 constitutes the output port. The voltage difference between nodes P1 and P3 constitutes the input signal, with the voltage difference between nodes P2 and P4 constituting the output signal. The nodes P2 and P4 may be directly connected to the reference node (ground) or through an additional inductor. The presence or absence of the inductor (for example, if the source is connected to ground through a via or not) depends on the technology used to manufacture the device and how the device is manufactured (for instance, if vias to ground are available in that technology). The presence of the inductor adds further steps to the application of the present invention but it is easily handled by someone skilled in the art. The model is further partitioned in core components and external components. The removal of the external components $\hat{r}_{gd}/P_d$ and $\hat{c}_{gd}P_d$ yields a core model that is unilateral, i.e., no signal is found between nodes P1 and P3 if a signal is applied between P2 and P4.

As noted above, the Pospieszalski noise model has been verified as being well suited for a scalable implementation against both bias and size $P_d$. The core model is a unilateral small-signal model of the transistor amplifying the incoming signal, biased at a given drain current $I_{DS}$ and drain-source voltage $V_{DS}$. The drain current $I_{DS}$ is proportional to the size $P_d$ of the device: $I_{DS} = J_{DS} * P_d$, where $J_{DS}$ is the current density. The noise sources in the model are associated with the 3 resistors $\hat{r}_{gs}/P_d$, $\hat{r}_{ds}/P_d$, and $\hat{r}_{gd}/P_d$ shown in FIG. 1. The key assumption of the model is that the noise generation within the FET device can be fully described by associating a non-physical temperature with the resistors of the core model. In particular, published results have confirmed that: (1) the resistor $\hat{r}_{gd}/P_d$ can be assumed to be at room temperature ($T_{gd} = T_0$, typically 290K) and the noise source associated with it delivers an available noise power equal to $P_{gd} = kT_{gd}B = kT_0B$; (2) the resistor $\hat{r}_{gs}/P_d$ can be assumed to be at a temperature close to room temperature ($T_{gs} \approx T_0$) and the noise source associated with it delivers an available noise power equal to $P_{gs} = kT_{gs}B \approx kT_0B$; and (3) the temperature of the resistor $\hat{r}_{ds}/P_d$ is far higher than room temperature ($T_{ds} >> T_0$) and the noise source associated with it delivers an available noise power equal to $P_{ds} = kT_{ds}B >>> kT_0B$. While the noise temperatures provide an insight of the noise mechanisms internal to the device, their determination allows the noise parameters to be calculated.

Figure 2:
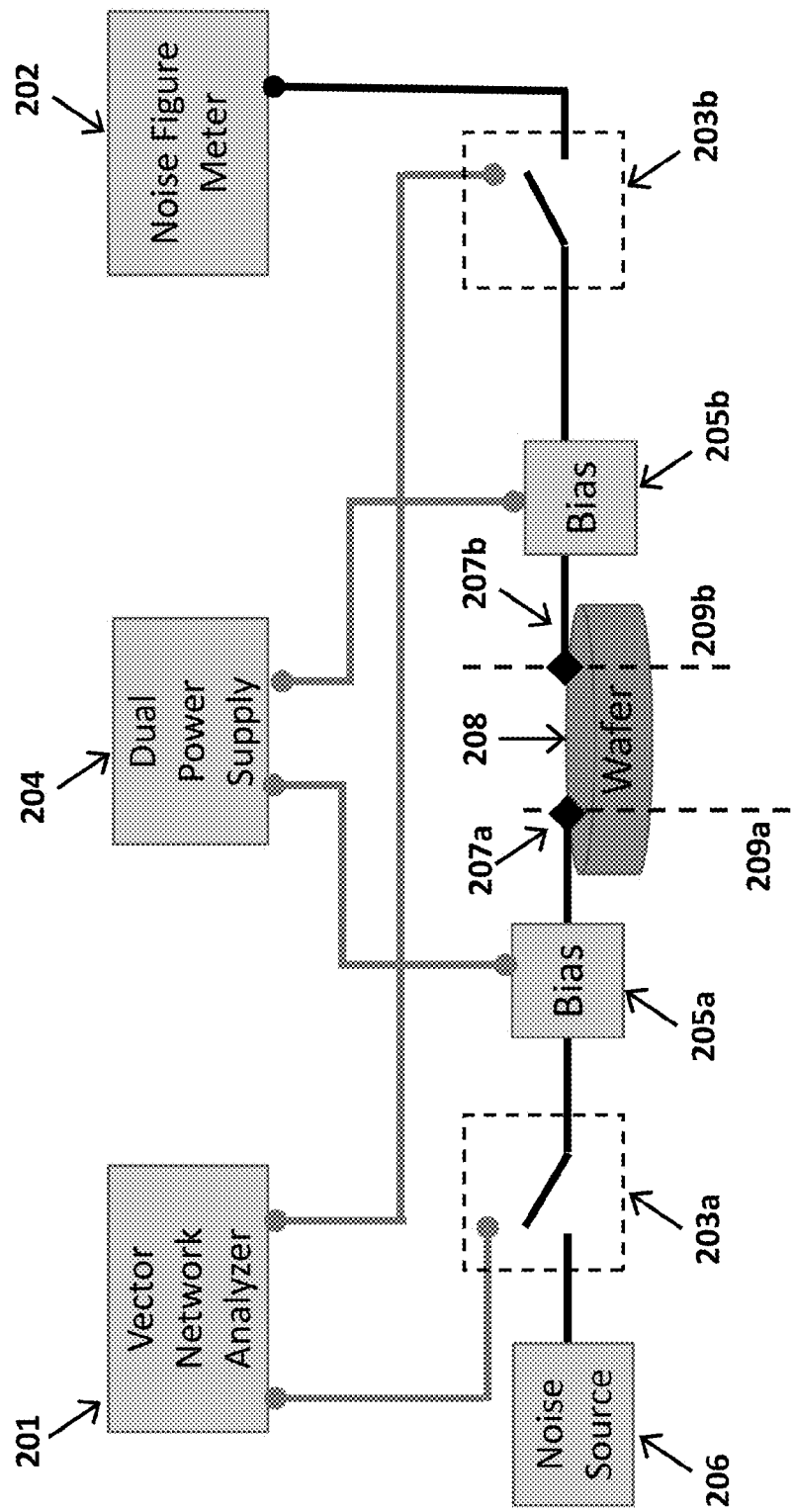
FIG. 2 is a block schematic illustrating aspects of an on-wafer measurement setup used in extracting the noise components of a microwave network in accordance with the present invention.

FIG. 2 is a block schematic illustrating aspects of a setup for collecting data for use in characterizing an on-wafer transistor in accordance with the present invention. As would be appreciated by one skilled in the art, the setup illustrated in FIG. 2 is merely exemplary, and can be easily modified depending on which instruments are available at that time, so long as the setup is able to make scattering parameter and noise figure measurements. Irrespective of the configuration, however, in contrast to a standard setup for noise parameter measurement, in a setup in accordance with the present invention, a source tuner is not required.

As illustrated in FIG. 2, a setup for use in accordance with the present invention includes a network analyzer such as Vector Network Analyzer 201 or any other suitable device configured to measure scattering parameters; a noise figure meter 202 configured to measure the noise figure F of the device; RF switches 203a/203b to switch between network analyzer 201 and noise figure meter 202 without moving the probes while they make contact with the device; a dual power supply 204 configured to bias the gate and drain of the device independently through 2 bias tees 205a/205b; a noise source 206 for noise figure measurement; and a set of wafer probes 207a/207b configured to connect the setup to the on-wafer device 208 being analyzed. Coaxial cables are used to connect the equipment to the wafer probes. Connections are dependent on the frequency at which measurements are made and the particular choice is left to the person skilled in the art that executes the measurement. The setup is calibrated for scattering parameters and noise figure measurements according to standard procedures known to a person skilled in the art.

The planes 209a and 209b represent a calibrated interface at the input and output of the on-wafer structure, respectively. Commercially available calibration standards are used for the network analyzer calibration. Standard calibrations refer scattering parameters to 50Ω although a different reference impedance can be used by a person skilled in the art.

Network analyzer 201 interfaces with wafer die 208 by means of wafer probes 207a/207b. The connection between the network analyzer and the wafer probes is implemented by coaxial cables or suitable connections as imposed by the frequency at which measurements are collected. Typically, Ground-Signal-Ground probes are used for transistor characterization, though any other suitable probe, e.g., a GS probe, may be used with a different transistor layout to meet the measurement requirement such as the frequency range. Any non-ideality associated with the setup components can be addressed by a person skilled in the art during calibration.

Figure 3:
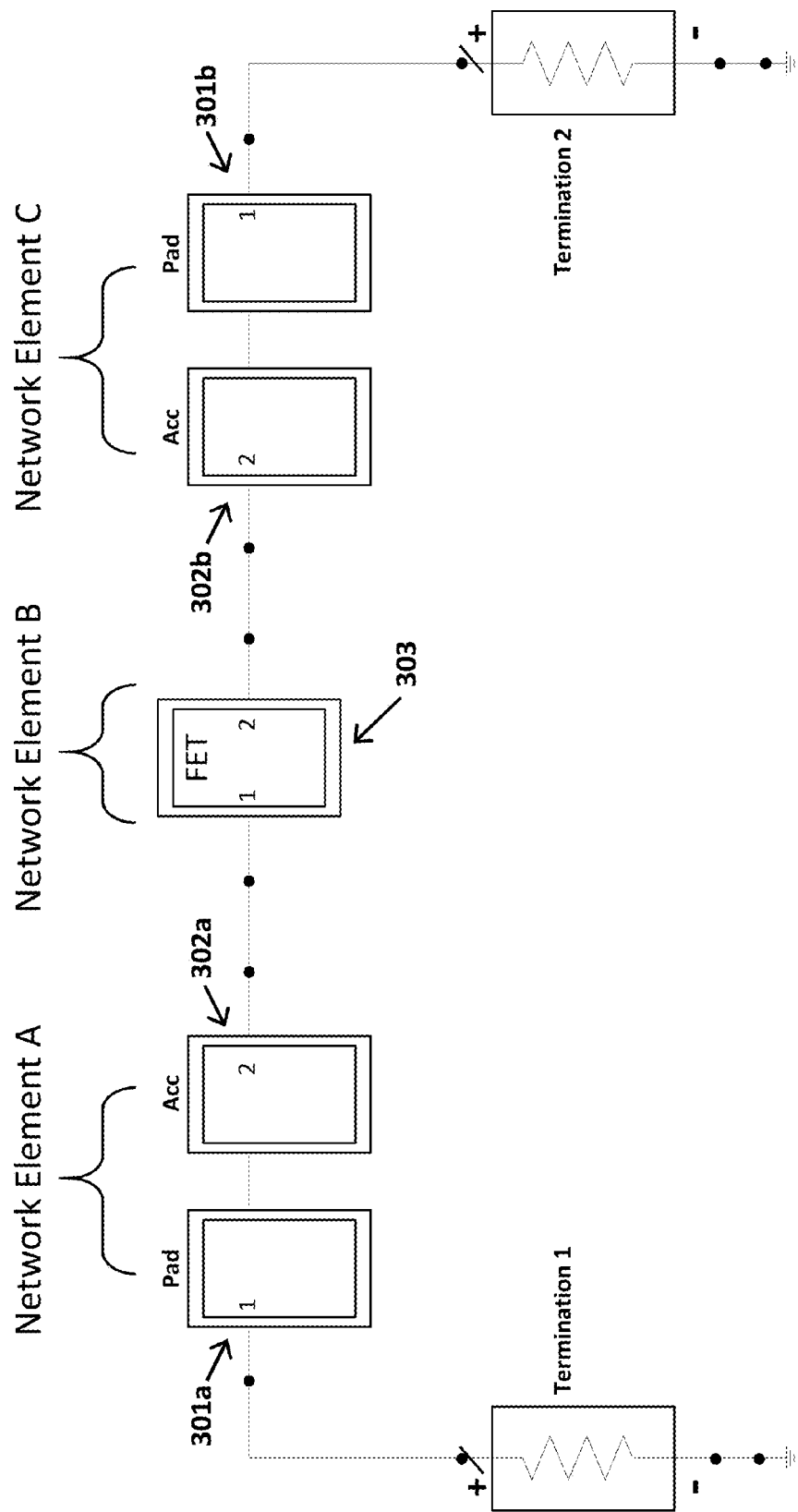
FIG. 3 is a block schematic illustrating aspects of an electrical model of the network structures between planes 209a and 209b shown in FIG. 2
Figure 4A:
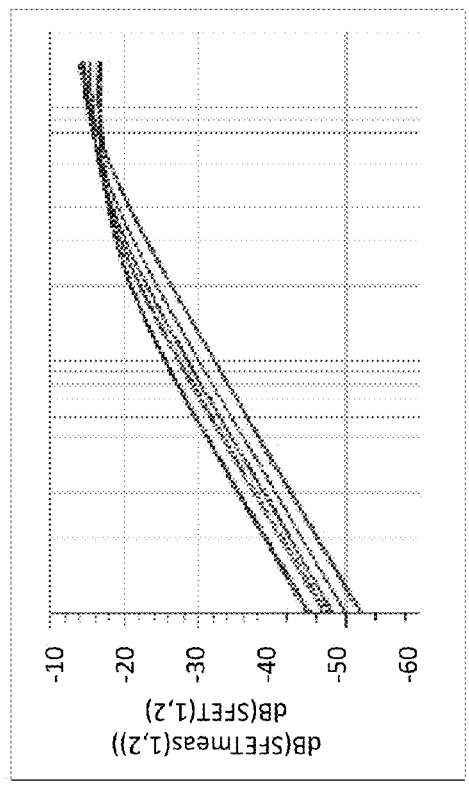
FIGS. 4A-4D are plots depicting the magnitude (in dB) of the measured scattering parameters $S_{11}$, $S_{12}$, $S_{21}$ and $S_{22}$, respectively, and the corresponding simulated scattering parameters.
Figure 4B:
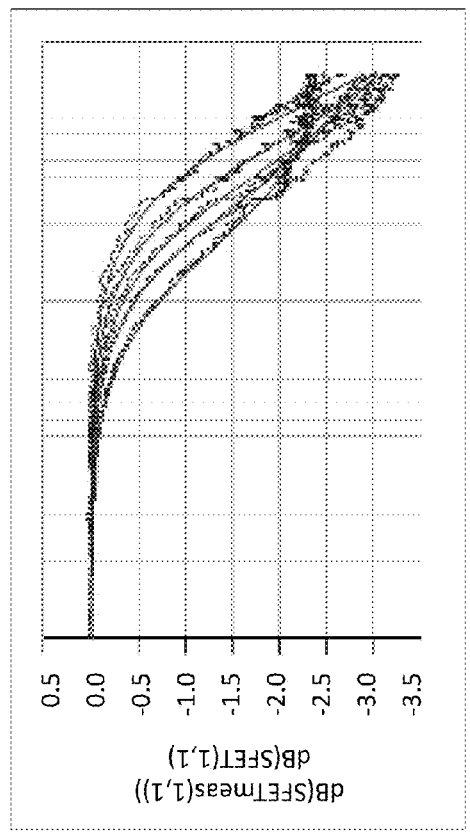
Figure 4C:
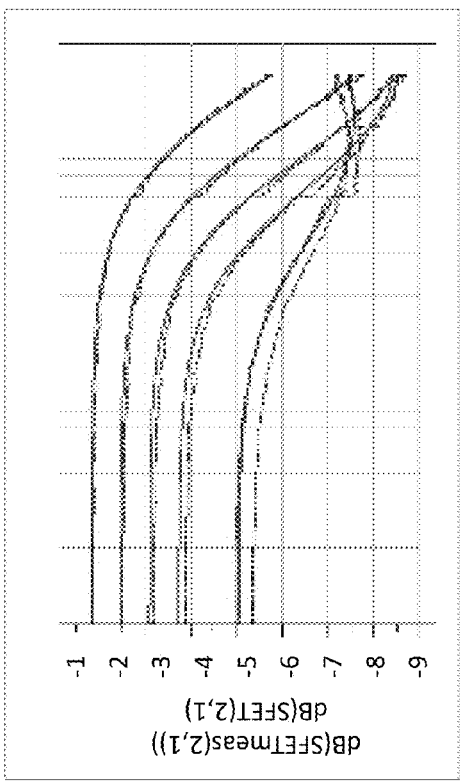
Figure 4D:
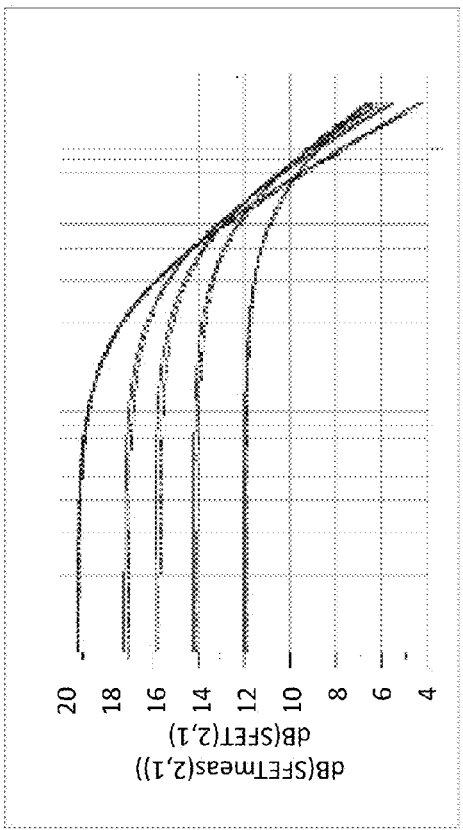

FIG. 3 is a block schematic illustrating aspects of the electrical model associated with the embedded on-wafer device under probe measurement placed between plane 209a and 209b in FIG. 2, in which planes 209a and 209b are represented by Terminations 1 and 2, respectively, shown in FIG. 3.

The schematic shown in FIG. 3 illustrates the embedded on-wafer networks between Terminations 1 and 2. As illustrated in FIG. 3, these networks include FET 303, designated as Network Element B, and pad and access lines 301a/302a and 301b/302b, collectively designated as Network Elements A and B. Each of Network Elements A, B, and C generates noise which contributes to the noise figure $F_{meas}$ measured by noise figure meter 202 shown in FIG. 2. In addition, each of network elements A, B, and C is a linear network which can be represented by a corresponding matrix in the representation (e.g., scattering parameter or transmission matrix representation) of choice.

As described in more detail below, the present invention provides a method for determining the noise temperatures of an on-wafer microwave FET modeled with a Pospieszalski noise model illustrated in FIG. 1. Following a standard calibration of an on-wafer measurement setup such as the setup illustrated in FIG. 2 with procedures familiar to a person skilled in the art, that guarantee calibration up to and including the probe tips for both scattering parameter and noise figure measurements, the noise temperatures of a microwave two-port network such as an on-wafer microwave FET illustrated in FIG. 3 can be determined using a method that includes the following steps, described here with reference to the structures and networks illustrated in FIGS. 2 and 3:

1. Determine the parasitic elements associated with a suitable electrical model of the on-wafer structures (network elements A and C shown in FIG. 3) embedding the transistor (network element B shown in FIG. 3) by measuring equivalent structures fabricated on the same wafer. A suitable electrical model may include a shunt capacitor (pad) and a series inductor (access line) such as pads 301a/301b and access lines 302a/302b shown in FIG. 3, though additional elements may be considered by a person skilled in the art. This step of determining the parasitic elements includes: (a) calibrating the network analyzer up to probe tips 207a/207b with standard calibration procedures familiar to a person skilled in the art; (b) measuring the scattering parameters of the equivalent on-wafer structures with the calibrated vector network analyzer 201 and storing the result in a data file; (c) applying standard mathematical transformations to transform the measured data from scattering S to admittance Y parameters; (d) using the resulting Y parameters to determine the pad contribution; (e) subtracting the contribution of pads 301a/301b from the Y parameter; (f) transforming the result to Z parameters to determine the contribution of the access lines 302a/302b; and (g) verifying the result against the measured data to confirm the models represented by network elements A and C.

2. For every frequency of interest and for each of n=1, 2, . . . , N chain networks ABC, each having a corresponding $n^{th}$ network element B comprising an $n^{th}$ transistor device having a corresponding device size $P_{d,n}$, each network element B being represented by the same circuit topology, all of the N transistor devices being biased at the same voltage $V_{DS}$ and current density $J_{DS}$,
   (a) Measure the scattering parameters with the calibrated vector network analyzer 201 and store the data in a corresponding data file;
   (b) Measure the noise figure $F_{meas,n}$ of the device associated with a source admittance $Y_S$ with standard noise figure measurement equipment and store the data in a corresponding data file. A 50Ω reference impedance is typical of microwave instruments, and in such a case $Y_S=(1/50)=20$ [mS] and $F_{meas,n}$ is a standard noise figure commonly referred to in the art as $F_{50}$. However, the actual value of the source admittance $Y_S$ may be determined during calibration of the setup and so it may vary from the nominal value. The actual value of $Y_S$ can easily be handled by a person skilled in the art and correctly used for the purpose of this invention.

3. Determine the core model components, normalized to the device periphery $P_d$: $\hat{r}_{gs}, \hat{r}_{ds}, \hat{r}_{gd}$ (in [Ω*mm]); $\hat{c}_{gs}, \hat{c}_{ds}, \hat{c}_{gd}$ (in [PF/mm]); $|\hat{g}_m|$ (in [mS/mm]); and τ in [ps] through standard transformations of the measured scattering parameters. This step includes (a) retrieving the data of the scattering parameters $S_n$ of the $n^{th}$ FET device represented by the $n^{th}$ network element B; (b) transforming the scattering parameters $S_n$ into chain matrix (ABCD) parameters $T_n$; (c) de-embedding the contributions of network A and C (e.g., as shown in FIG. 3) from the chain parameters $T_n$ to obtain the chain parameters $T_{FET,n}$ of the embedded transistors; (d) transforming the chain parameters $T_{FET,n}$ into either admittance parameters $Y_{FET,n}$ or impedance parameters $Z_{FET,n}$ to determine the component values of the model according to procedures familiar to a person skilled in the art; and (e) verifying the resulting electrical model against the measured data (see, e.g., FIG. 4).

4. De-embed the noise contributions of the parasitic components from the measured noise figure $F_{meas,n}$ obtained in step 2 in order to obtain the noise figure of the embedded transistor $F_{FET,n}$. Obtaining this noise figure $F_{FET,n}$ includes (a) retrieving the data of the noise figure $F_{meas,n}$ of the embedded transistor with known size $P_{d,n}$ from the appropriate data file created in step 2; (b) de-embedding the noise contribution of networks A and C to obtain the transistor's noise figure $F_{FET,n}$ from the measured noise figure $F_{meas,n}$ with a method known by a person skilled in the art. Steps (a) and (b) are repeated for each of n=1, 2, . . . N evaluated transistors biased at the same $V_{DS}$ and current density $J_{DS}$ and having varying device sizes $P_{d,n}$, where the size is typically expressed in terms of gate width in [μm] for a constant gate length L [μm].

5. Find the equivalent normalized noise temperatures $t_{gs}$, $t_{ds}$, and $t_{gd}$ by describing the network of FIG. 3 in terms of its network and correlation matrices and using Equation (3) to relate the measured noise figure to the equivalent noise temperatures. This step represents the key feature of the present invention and is described in detail below. Once the values of $t_{gs}$, $t_{ds}$, and $t_{gd}$ are calculated analytically, the computer can then easily find the noise temperatures $T_{gs}$, $T_{ds}$, and $T_{gd}$ associated with $\hat{r}_{gs}$, $\hat{r}_{ds}$, $\hat{r}_{gd}$, respectively, where $T_{gs}=t_{gs}*T_0$, $T_0=290K$; $T_{ds}=t_{ds}*T_0$; and $T_{gd}=t_{gd}*T_0$.

The execution of steps 1 and 2a above yield the information required to execute step 3, while execution of step 2b provides the information needed to execute steps 4 and 5.

It should be noted that selection of $Y_S=(1/50)=20$ [mS] for the measurement of the noise figure F is a consequence of the use of standard microwave measurement equipment which is nominally designed to match a load of 50 [Ω]. The actual value of $Y_S$ can be determined experimentally and is used in the calculations based on Equation (3); it is not a limitation on the invention, and other measurements of the noise figure F for an admittance $Y_S$ not equal to 20 [mS] may also be used.

Steps 1-5 in the method of the present invention will now be described in more detail.

Additional detail regarding the derivation of some of the expressions used in the discussion above is set forth in Luciano Boglione, "A noise parameters extraction procedure suitable for on-wafer device characterization," Proceedings of Semiconductor Conference Dresden-Grenoble (ISCDG), 2012 International, 24-26 Sep. 2012, pp. 135-138, ("Boglione 2012") the text of which was filed as part of Provisional Application No. 61/703,384 and which is hereby incorporated by reference into the present disclosure in its entirety.

Step 1: Determine Parasitic Elements Associated with Embedded on-Wafer Structures.

The method for finding the noise parameters through the determination of the equivalent noise temperatures associated with a standard device noise model of an active two-port microwave network in accordance with the present invention begins with determining the parasitic elements associated with the on-wafer structures represented by network elements A and C, such as pads 301a/301b, and access line structures 302a/302b illustrated in the schematic shown in FIG. 3. Such parasitic elements may include pad admittance) $Y_{pad}=G_{pad}+j\omega C_{pad}$ and input $Z_{acc,i}$ and output $Z_{acc,o}$ access line impedances. The assumption that $Z_{acc,i}=Z_{acc,o}=Z_{acc}=R_{acc}+j\omega L_{acc}$ may be made if the input and output embedding structures are physically similar.

The pads and the access line structures, which allow an electrical and mechanical contact to occur between wafer probes and the on-wafer device under test, are duplicated and manufactured on the same wafer. The assumption that input and output embedding structures are the same is not a limiting assumption because they are engineered at the time of the device design. Any embedding structures may be handled similarly by a person skilled in the art. In this step, the scattering parameters of the embedding structures alone are measured over the range of frequencies of interest.

Measurement can be made using any suitable equipment or method, such as a standard network analyzer and, using any suitable transformation methodology known in the art, the measurements can be transformed into Y or Z representation to determine the components of the network, e.g., as shown in FIG. 2. The noise figure of the pad and access line can be calculated from the measured scattering parameters using standard theoretical results well known in the art. See, e.g. D. Pozar, Microwave Engineering, 4th Ed. (2012), p. 506. Transformation and component value calculations can be executed by a computer using appropriate scripts developed in MATLAB or any other suitable software environment known in the art.

The pad and access line structures are routinely manufactured as part of the wafer production of transistors. The modeling of these structures may require additional components to model their behavior over the frequency range of interest; such components are well known in the art and need not be detailed here. The determination of the structure's scattering matrix by measurement allows direct calculation of its noise figure as well as its noise correlation matrix. See Boglione, L., R. D. Pollard, V. Postoyalko, and T. Alam, "Specifications for a linear network simultaneously noise and available-power matched," Microwave and Guided Wave Letters, IEEE, vol. 6, no. 11, pp. 407-409, November 1996. Consequently, the complexity of the passive structures can always be correctly accounted for and do not affect the de-embedding of their contribution from the measured data of the device under test.

Steps 2a and 2b: Measure Scattering Parameters and Noise Figure $F_{meas}$.

In the second step, as noted above, for each of n=1, 2, . . . , N device having a corresponding periphery $P_{d,n}$ and being biased at a constant drain current density $J_{DS}$ and drain-source voltage $V_{DS}$, the scattering parameters of the device (step 2a) and the noise figure $F_{meas,n}$ associated with a source admittance $Y_S$ (step 2b) are measured. Suitable power supply cables can be used to deliver the required drain current $I_{DS,n}=J_{DS}*P_{d,n}$ at constant $V_{DS}$ and set the required gate-source voltage $V_{GS,n}$ to yield $I_{DS,n}$. Measurement of the scattering parameters and noise figure can be accomplished using any suitable means known in the art. For example, a calibrated vector network analyzer can determine the scattering parameters through any standard technique known in the art. Noise figure measurements can be made at the same time as the measurement of the scattering parameters if the vector network analyzer is capable of executing such a measurement; otherwise measurements of the noise figure can be made with a standard noise figure meter. In either cases, additional components commercially available such as cables, connectors, bias tees, probes, etc. may be used to execute the measurement as seen fit by a person skilled in the art. The deliverables are tables of scattering parameters and noise figure values as a function of the measurement frequency for each transistor size $P_{d,n}$ and bias point ($V_{DS}$ and $I_{DS,n}=J_{DS}*P_{d,n}$) at constant current density $J_{DS}$. Such tables may be in electronic form (e.g., data files) to enable a computer to perform appropriate calculations in accordance with the present method.

Step 3: Determine the Core Model Components Normalized to $P_d$.

Using the values and parameters found in steps 1 and 2a above, the core model components $\hat{r}_{gs}$, $\hat{r}_{ds}$, $\hat{r}_{gd}$ (in [Ω*mm]); $\hat{c}_{gs}$, $\hat{c}_{ds}$, $\hat{c}_{gd}$ (in [pF/mm]); $|\hat{g}_m|$ (in [mS/mm]); and τ in [ps] are determined, where $\hat{r}_{gs}$, $\hat{r}_{ds}$, $\hat{r}_{gd}$, $\hat{c}_{gs}$, $\hat{c}_{ds}$, and $\hat{c}_{gd}$ are the resistance and capacitances of the device, respectively, normalized to the device periphery $P_d$, $|\hat{g}_m|$ is the transconductance in [mS/mm], and $\tau$ in [ps] is the drain-source delay time associated with the device transconductance. Extraction of the component values of network element B shown in FIG. 3 modeled by the Pospieszalski model shown in FIG. 1 is a standard practice known in the art, and may rely on conventional measurement of the scattering parameters followed by a transformation, by any appropriate means, into a suitable representation (e.g. Y or Z representation) to extract the values of these core model components.

The components in the transistor model illustrated in FIG. 1 can be used to describe the device in terms of a hybrid matrix representation which is notable because its correlation matrix includes only uncorrelated noise sources $$\begin{bmatrix} V_1 \\ I_2 \end{bmatrix} = \begin{bmatrix} \frac{1}{\hat{y}_{gs}P_d} & 0 \\ -j\Omega & \hat{y}_{gs}P_d \end{bmatrix} \begin{bmatrix} I_1 \\ V_2 \end{bmatrix} + n_{core}^H, \quad (6a)$$

$$n_{core}^H n_{core}^{H+} = 4N_i \begin{bmatrix} t_{gs}\frac{\hat{r}_{gs}}{P_d} & 0 \\ 0 & t_{ds}\frac{P_d}{\hat{r}_{ds}} \end{bmatrix}, \quad (6b)$$

$$\left(\frac{1}{\hat{y}_{gs}}\right)^{-1} = \hat{r}_{gs} + \frac{1}{j\omega\hat{c}_{gs}}[\Omega * mm], \quad (6c)$$

$$\hat{y}_{ds} = \frac{1}{\hat{r}_{ds}} + j\omega\hat{c}_{ds}[mS/mm], \quad (6d)$$

$$\omega_t = \frac{\hat{g}_m}{\hat{c}_{gs}}[rad/s], \text{ and} \quad (6e)$$

$$\Omega = \frac{\omega_t}{\omega}[-] \quad (6f)$$

where + is the hermitian conjugate operation, $\hat{y}_{gs}$ and $\hat{y}_{ds}$, respectively, are the gate-source and drain-source admittances normalized to the device size $P_d$ expressed in terms of the model components at the frequency of operation $f_0=\omega/2\pi$, and the subscript "core" in these equations refers to the core model shown in FIG. 1. The constant $\omega_t$ represents the transition frequency at which the magnitude of the current gain is 1 (0 dB); it is formally a complex number because $\hat{g}_m = \hat{G}_m e^{-j\omega\tau}$, where $\hat{G}_m$ is the magnitude of $\hat{g}_m$. If the transistor's channel is electrically short (i.e., if $\omega\tau<<1$), then $|\hat{g}_m| \approx \hat{G}_m$. Equations (6a)-(6f) can be easily written by considering the core model of FIG. 1, which does not include the feedback element $(\hat{r}_{gd}/P_d) - (\hat{c}_{gd}P_d)$.

In the method of the present invention, linearity is assumed, and therefore, using any appropriate linear transformation known in the art, the noise vector $n_{core}^H$ in Equation 6(a) above can be transformed mathematically and evaluated numerically by any suitable computer script into a noise vector $n_{core}^Y$ in Y representation. Once this is accomplished, the gate-drain admittance $$\left(\frac{1}{\hat{y}_{gd}}\right)^{-1} = \hat{r}_{gd} + \frac{1}{j\omega\hat{c}_{gd}}[\Omega * mm] \quad (7)$$

can be added to both the signal matrix and the noise vector to obtain $$\begin{bmatrix} I_1 \\ I_2 \end{bmatrix} = P_d \begin{bmatrix} \hat{y}_{gs} & 0 \\ -j\Omega\hat{y}_{gs} & \hat{y}_{ds} \end{bmatrix} \begin{bmatrix} V_1 \\ V_2 \end{bmatrix} + P_d\hat{y}_{gd} \begin{bmatrix} 1 & 1 \\ 1 & 1 \end{bmatrix} \begin{bmatrix} V_1 \\ V_2 \end{bmatrix} + \underbrace{n_{core}^Y + n_{gd}^Y}_{n_{FET}^Y} \quad (8a)$$

and $$n_{FET}^Y n_{FET}^{Y+} = 4N_i(C_{gs}^Y t_{gs} + C_{ds}^Y t_{ds} + C_{gd}^Y t_{gd}) \quad (8b)$$

where $n_{FET}^Y n_{FET}^{Y+}$ is the correlation matrix $C_{FET}^Y$ in Y representation of the FET, i.e., of network element B, modeled as in the model of FIG. 1, in which $$C_{gs}^Y(\omega; P_d) = |\hat{r}_{gs}\hat{y}_{gs}|^2 \begin{bmatrix} 1 & j\Omega \\ -j\Omega & |\Omega|^2 \end{bmatrix} \frac{P_d}{\hat{r}_{gs}} \quad (9a)$$

$$C_{ds}^Y(\omega; P_d) = \Re e\{\hat{r}_{ds}\hat{y}_{ds}\} \begin{bmatrix} 1 & 1 \\ 1 & 1 \end{bmatrix} \frac{P_d}{\hat{r}_{ds}} \quad (9b)$$

$$C_{gd}^Y(\omega; P_d) = \Re e\{\hat{r}_{gd}\hat{y}_{gd}\} \begin{bmatrix} 1 & 1 \\ 1 & 1 \end{bmatrix} \frac{P_d}{\hat{r}_{gd}} \quad (9c)$$

The expressions in Equations (9a) (9c) highlight the proportional dependence of the correlation matrix $C_{FET}^Y$ of the FET on its device periphery $P_d$ for given core components and a given angular frequency $\omega$ of operation. In addition, as shown in Equation (8b), because $C_{FET}^Y=4N_i(C_{gs}^Y t_{gs}+C_{ds}^Y t_{ds}+C_{gd}^Y t_{gd})$, it is linearly dependent on the normalized equivalent noise temperatures $t_{gs}$, $t_{ds}$, and $t_{gd}$.

Step 4: De-Embed the Noise Contributions of the Parasitic Components.

As noted above, de-embedding of the device from the surrounding parasitic components represented by network elements A and C shown in FIG. 3 (e.g., pad capacitance, access lines between the pad and the transistor nodes, etc. or any other embodiment) is required in order to move the measurement planes to the input and output ports of the active device, and so in the fourth step of a method for finding noise temperatures of a two-port microwave network in accordance with the present invention, the noise contributions of the parasitic components are de-embedded from the measured noise $F_{meas,n}$ for each device n=1, 2, . . . , N. The use of correlation matrices in transmission T or (ABCD) representation allows the de-embedding procedure to be implemented numerically, where, using appropriate software, a computer can de-embed the noise contributions using the correlation matrices of the measured embedding networks in the appropriate representation.

For example, with reference to FIG. 3, it is possible to assume that the scattering parameters and the noise figure of the chain network ABC between Termination 1 and Termination 2 have been measured; that the scattering parameters of the networks A, B and C have been determined; and that the correlation matrices of network A and C have been determined through standard methods known to a person skilled in the art. Then, after transforming all the data in transmission T or (ABCD) representation, the measured noise correlation matrix $C_{T_{meas}}$ of the network has the form $$C_{T_{meas}} = C_{T_{ABC}} = C_{T_A} + T_A C_{T_B} T_A^+ + T_B T_A C_{T_C} T_A^+ T_B^+ \quad (10a)$$

where $C_T$ and T are the correlation and transmission representation matrices, respectively, of the network elements. Rearranging equation (10a) gives the de-embedded noise correlation matrix of network element B, i.e., of the FET, in transmission T or (ABCD) representation:

$$C_{T_B} = T_A^{-1}(C_{T_{ABC}} - C_{T_A} - T_B T_A C_{T_C} T_A^+ T_B^+)(T_A^+)^{-1} \quad (10b)$$

Note that both $C_{T_B}$ in Equation (10b) and $C_{FET}^Y$ in Equation (8b) represent a correlation matrix for the FET, where $C_{T_B}$ and $C_{FET}^Y$ are the noise correlation matrices of the FET in T (ABCD) and Y representation, respectively.

In addition, $F_{meas,n}$ is the noise figure $F(Y_S)$ measured by a noise figure meter for the $n^{th}$ FET having a corresponding size $P_{d,n}$ at the reference plane set by the wafer probes. $F_{meas,n}$ is equivalent to the noise figure of Equation (3a) above, i.e., a noise figure expressed in terms of the correlation matrix of the measured noise, where $$F_{meas,n} = F(Y_S) = 1 + \frac{y_s^+ C_{T_{meas,n}} y_s}{4 N_i G_s}$$

for each $n^{th}$ FET. Using the form of $C_{T_{meas}}$ in Equation (8a) in the expression for $F_{meas}$, we get the following expression for $F_{meas,n}$ for each of the n=1, 2, . . . , N FETs of interest:

$$F_{meas,n} = F(Y_S) = 1 + \frac{y_s^+ (C_{T_A} + T_A C_{T_{B,n}} T_A^+ + T_{B,n} T_A C_{T_C} T_A^+ T_{B,n}^+) y_s}{4 N_i G_s}. \quad (11)$$

Rearranging Equation (11), we see that the measured noise figure $F_{meas,n}$ of the embedded structure can be used to obtain the de-embedded noise contribution of the $n^{th}$ FET (i.e., the $n^{th}$ network element B), i.e., $$y_s^+ T_A C_{T_{B,n}} T_A^+ y_s = 4 N_i G_s (F_{meas,n} - 1) - y_s^+ C_{T_A} y_s - y_s^+ T_{B,n} T_A C_{T_C} T_A^+ T_{B,n}^+ y_s \quad (12)$$

where the terms on the right hand side of Equation (12) are known.

The steps of measuring the noise figure for the entire embedded structure and de-embedding the noise figure for the FET are repeated for n different FETs having different sizes $P_{d,n}$ to obtain de-embedded noise figures $F_{FET,n}$ for each of the n=1, 2, . . . , N devices.

Step 5: Calculate Noise Temperatures.

In this final step of the method for extracting noise temperatures in accordance with the present invention, the computer can calculate the equivalent noise temperatures $t_{gs}$, $t_{ds}$, $t_{gd}$ and $T_{gs}$, $T_{ds}$, $T_{gd}$ associated with the core model components $\hat{r}_{gs}$, $\hat{r}_{ds}$, $\hat{r}_{gd}$, respectively, using $F_{meas,n}$, the measured noise figure of the $n^{th}$ FET (i.e., the $n^{th}$ network element B) having a corresponding periphery $P_{d,n}$, with the noise contributions of network elements A and C de-embedded as described above.

As noted above, the noise contribution $y_s^+ T_A C_{T_{B,n}} T_A^+ y_s$ expressed in Equation (12) can be obtained for each $n^{th}$ available FET device having a corresponding size $P_{d,n}$, with all of the n devices being biased at the same $V_{DS}$ and current density $J_{DS}$.

The term $y_s^+ T_A C_{T_{B,n}} T_A^+ y_s$ contains known quantities $y_s$ (i.e., the vector (3b) containing the source admittance $Y_S$ for the device) and $T_A$ (i.e., the transmission matrix for network element A). In addition, as noted above, the correlation matrix $C_{T_B}$ in transmission T (ABCD) representation corresponds to the noise correlation matrix $C_{FET}^Y = 4 N_i (C_{gs}^Y t_{gs} + C_{ds}^Y t_{ds} + C_{gd}^Y t_{gd})$ in Y representation of Equations (8b) and (9a)-(9c), where all the terms are known except for the normalized temperatures $t_{gs}$, $t_{ds}$, and $t_{gd}$ for that device. By using the correlation matrix $C_{FET}^Y = 4 N_i (C_{gs}^Y t_{gs} + C_{ds}^Y t_{ds} + C_{gd}^Y t_{gd})$ in Equation (12) and rearranging, an expression of the type of Equation (8b) linearly dependent on the unknown normalized noise temperatures can be obtained for each of the n=1, 2, . . . , N devices, i.e., $$\frac{4 N_i G_s (F_{meas,n} - 1) - y_s^+ C_{T_A} y_s - y_s^+ T_{B,n} T_A C_{T_C} T_A^+ T_{B,n}^+ y_s}{4 N_i P_{d_n}} = \quad (13)$$
$$A_n t_{ds} + B_n t_{gs} + C_n t_{gd}$$

where the subscript "n" refers to the measurement of the $n^{th}$ device having known size $P_{d,n}$. The coefficients $A_n$, $B_n$, and $C_n$ are functions of the device size $P_{d,n}$ resulting from the transformations between Y and T representations, and can be determined by a computer program written by a person skilled in the art using Equations (9a)-(9c) and Equation (3a) along with appropriate transformations between those representations.

As understood by one skilled in the art, in order to solve for the three unknowns $t_{gs}$, $t_{ds}$, and $t_{gd}$, at least three values of $F_{meas,n}$ and the coefficients $A_n$, $B_n$, and $C_n$ are needed. Once a sufficient number of noise figures $F_{meas,n}$ and corresponding coefficients $A_n$, $B_n$, and $C_n$ are input, using numerical methods well within the abilities of a skilled practitioner, the computer can then solve Equation (13) for the three unknowns $t_{gs}$, $t_{ds}$, and $t_{gd}$, either directly if it receives input of three noise figures $F_{meas,n}$ (i.e., N=3), or by a least-squares method if it receives input of more than three values of $F_{meas,n}$ (i.e., N>3).

In many cases, experimental verification in extracting their equivalent circuits will support the assumption that network elements A and C are contributing negligible noise to the measurement of the overall noise figure $F_{meas,n}$, and in such cases, Equation (13) simplifies to:

$$\frac{(F_{meas,n} - 1) G_s}{P_{d_n}} = A_n t_{ds} + B_n t_{gs} + C_n t_{gd}, \quad (14)$$

where one skilled in the art would understand that the coefficients $A_n$, $B_n$, $C_r$, are still functions of the lossless components describing network elements A and C.

In addition, in some embodiments, the pads and access lines making up network elements A and C are not present, with noise measurements being made directly on the FET, and in such cases, the noise temperatures can be found using Equation (14) above. In such embodiments, one or more aspects of step (1) described above may also be omitted or modified to reflect the absence of such pads and/or access lines. One skilled in the art would readily be able to modify this or any other of the method steps described herein accordingly.

In any case, once the values of $t_{gs}$, $t_{ds}$, and $t_{gd}$ are calculated analytically, the computer can then easily find the noise temperatures $T_{gs}$, $T_{ds}$, and $T_{gd}$ associated with $\hat{r}_{gs}$, $\hat{r}_{ds}$, $\hat{r}_{gd}$, respectively, where $T_{gs} = t_{gs} * T_0$, $T_0 = 290K$; $T_{ds} = t_{ds} * T_0$; and $T_{gd} = t_{gd} * T_0$. This is easily accomplished using conventional computer assisted design (CAD) tools.

Validation

The method of the present invention has been validated with a mix of measured and simulated data in order to streamline the calculations, and has been further validated experimentally by the inventor. See L. Boglione, "A novel extraction procedure to determine the noise parameters of on-wafer devices," International Microwave Symposium, Seattle Wash., 2-7 Jun. 2013. The original reason behind this choice was to avoid numerical errors from noisy measurements of $F_{50}$ while generating meaningful noise data from a valid measurement-based device model. Details of the methodology used to validate the method of the present invention are set forth in Boglione 2012, supra, and are not provided herein for the sake of brevity.

The scattering parameters $\hat{r}_{gs}$, $\hat{r}_{ds}$, $\hat{r}_{gd}$ (in [Ω*mm]); $\hat{c}_{gs}$, $\hat{r}_{ds}$, $\hat{c}_{gd}$ (in [PF/mm]); $|\hat{g}_m|$ (in [mS/mm]); and τ in [ps] were collected from 6 (i.e., N=6) GaN HEMT devices of different geometries and different sizes $P_d$. The core component values of these scattering parameters are shown in Table 1 below.

TABLE 1

| | |
|---|---|
| $\hat{r}_{gs} \approx 1.754$ [Ω * mm] | $\hat{c}_{gs} \approx 0.907$ [pF/mm] |
| $\hat{r}_{ds} \approx 70.706$ [Ω * mm] | $\hat{c}_{ds} \approx 0.224$ [pF/mm] |
| $\hat{r}_{gd} \approx 3.629$ [Ω * mm] | $\hat{c}_{gd} \approx 0.287$ [pF/mm] |
| $|\hat{g}_m| \approx 293.155$ [Ω * mm] | τ ≈ 1.396 [ps] |

Table 1 shows the values of the components of the transistor model obtained from scattering parameters measurements from 1 to 15 GHz according to the methods of this invention.

The plots in FIGS. 4A-4D show that a remarkable match between the values obtained by measurement and the values obtained from a device model using the data in Table 1. The results compare the magnitude of the scattering parameters measured at the reference planes set by the calibrated probes with the scattering parameters simulated at the same reference planes with a standard CAD tool. Consequently, the comparison between measured and simulated data includes the contributions of the embedding structures along with the contributions of the active device. The plots in FIGS. 4A, 4B, 4C, and 4D also show, respectively, the magnitude in dB of the measured scattering parameters $S_{11}$, $S_{12}$, $S_{21}$ and $S_{22}$ (dotted lines) vs. the respective simulated scattering parameters (solid lines).

FIGS. 5A-5D compare results obtained from a noise figure simulation made by a standard CAD tool and the calculated noise figure according with the present invention of the on-wafer embedded device depicted in FIG. 3. In both cases, the active device modeled by the components of Table 1 was used. The noise temperatures $T_{gs}$, $T_{ds}$, and $T_{gd}$ were selected a priori in order to execute a noise figure simulation with the standard CAD tool. The resulting noise figure was then input to a computer programmed according to the present invention to calculate the noise temperatures and verify that computer program yields the same values of noise temperatures $T_{gs}$, $T_{ds}$, and $T_{gd}$.

Figure 5A:
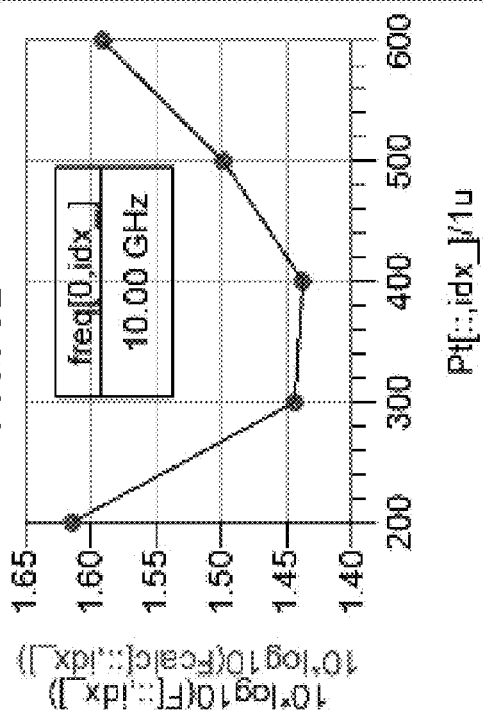
FIGS. 5A-5D are plots comparing the simulated noise figure with the noise figure calculated in accordance with the present invention.
Figure 5B:
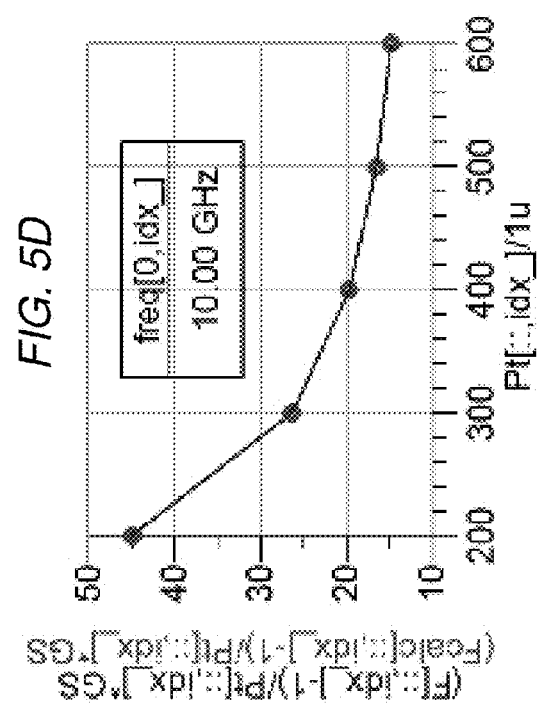
Figure 5C:
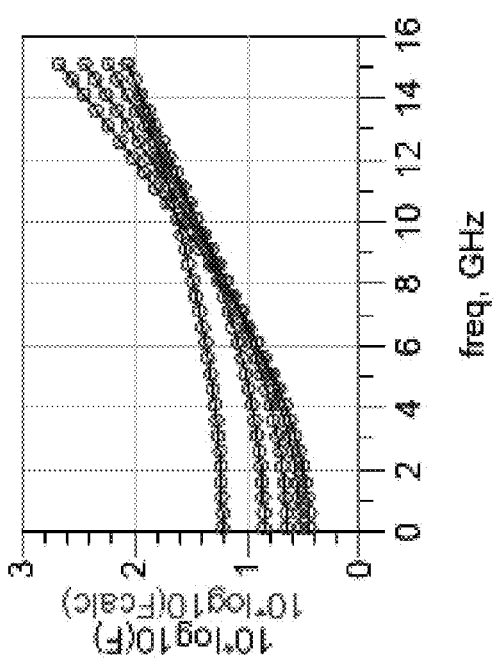
Figure 5D:
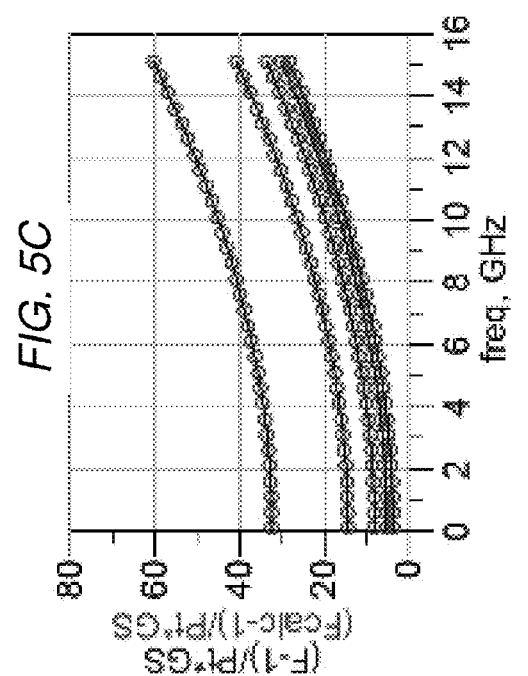

The plots in FIGS. 5A and 5C compare the noise figure F calculated by the method of the present invention (circles) with the noise figure obtained by the CAD tool (solid line). The plots in FIGS. 5B and 5D compare the results from Equation (13) over transistor size $P_d$ at a fixed frequency of 10 GHz, with circles representing the calculation results using the method of the present invention and the solid lines representing the results from the CAD tool. The size $P_d$ of the devices used in the data verification need not be the same as the size of the devices used in the measurement.

The plots in these FIGURES confirm the analytical methods described herein. The plots in FIGS. 4A-D confirm the validity of procedure described above to obtain the values of the transistor models from measured scattering parameters, while the plots in FIGS. 5A-5D demonstrate the validity of the analytical calculations described in the methods of the present invention to obtain the noise temperatures and calculate the noise figure of a device of size $P_d$ at the same bias point. These FIGURES support the use of this invention to simplify the determination of a scalable transistor noise model based on noise temperatures and facilitate circuit designs employing similar transistors that differ in size.

Advantages and New Features

The method for finding the noise temperatures of a microwave network in accordance with the present invention provides many advantages over such methods in accordance with the prior art.

One advantage is that the method of the present invention does not require external tuners in addition to the standard equipment for noise figure measurement, which makes the measurement of noise temperatures less expensive and easier to implement in both R&D and production environments. This features becomes more and more important as the measurement frequency increases to values where the cost of the tuner may be prohibitive or no tuner is available at all.

As a result of the lack of a need for external tuners, the method of the present invention also does not suffer from the frequency range limitation imposed by the tuners. Instead, the method of the present invention depends only on the equipment used to measure the noise figure F, allowing for continuous data collection over a wide frequency range.

In addition, noise temperatures are of particular interest and usefulness to fully characterize the noise performance of active devices. Once the noise temperatures $T_{gs}$, $T_{ds}$, and $T_{gd}$ are found, the noise parameters $F_{min}$ (minimum noise figure), $R_n$ (equivalent noise resistance) and $\Gamma_{Sopt}$ (optimum source reflection coefficient for minimum noise figure) of the device can be easily found using any conventional simulation tool known in the art or calculated through an appropriate computer script.

The method of the present invention overcomes the shortcomings of the standard measurement approaches in the prior art, and can streamline characterization efforts in the manufacture of such devices, providing benefits to manufacturers who may include it in their current small signal characterization process. This is a consequence of a simplified measurement setup which does not include an external tuner.

Thus, the method of the present invention provides a powerful tool for device manufacturers to characterize and model a transistor efficiently, with minimum equipment requirement and easily integrable within a standard measurement setup; and for integrated circuit designer to obtain a model able to generate the noise parameters of the device in use, over a wide range of frequencies and for the desired bias. The invention is based on an analytical procedure that is prone to automation through the use of a computer and independent of human dependent optimization. The invention promises to provide noise parameter data to interested customers of the device manufacturer, thereby enhancing the information delivered by a manufacturer to its customer.

It should be noted that although particular embodiments, aspects, and features have been described and illustrated, the invention described herein is not limited to only those embodiments, aspects, and features, and that modifications may be made by persons skilled in the art. The present application contemplates any and all modifications within the spirit and scope of the underlying invention described and claimed herein, and all such embodiments are within the scope and spirit of the present disclosure.

What is claimed is:

1. A computer-implemented method for determining noise temperatures of an on-wafer transistor device comprising a chain network ABC formed from a network element B embedded on a wafer together with a pair of network elements A and C connected thereto, each of network elements A and C comprising a pad and corresponding access line, the method comprising:

(a) determining at least one parasitic element associated with a network model of the network elements A and C, the parasitic element including at least one of a pad admittance $Y_{pad}$, an input access line impedance $Z_{acc,i}$, and an output access line impedance $Z_{acc,o}$ and storing data of the determined parasitic element in a corresponding data file, the step of determining the at least one parasitic element including:
  (i) using a network analyzer, measuring scattering S parameters of network elements A and C;
  (ii) transforming the scattering S parameters to admittance Y parameters;
  (iii) determining a contribution of the pad A to the admittance Y parameter and subtracting the contribution of the pad A to the admittance Y parameter; and
  (iv) transforming the resulting admittance Y parameter to a Z parameter to determine the contribution of the access line C to the admittance Y parameter;

(b) for each of n=1,2, . . . , N chain networks ABC, each having a corresponding $n^{th}$ network element B comprising an $n^{th}$ transistor device having a corresponding device size $P_{d,n}$, each network element B being represented by the same circuit topology, all of the N transistor devices being biased at the same voltage $V_{DS}$ and current density $J_{DS}$:
  (i) measuring a scattering parameter $S_n$ of the on-wafer transistor device with the network analyzer over a frequency of the transistor device and storing data of the scattering parameter $S_n$ in a corresponding data file; and
  (ii) for at least three chain networks ABC, measuring a corresponding on-wafer noise figure $F_{meas,n}$ over a frequency associated with a source admittance $Y_S$ of the device and storing data of the measured noise figure $F_{meas,n}$ in a corresponding data file;

(c) determining, from the measured scattering parameter $S_n$ of the $n^{th}$ transistor device, components $\hat{r}_{gs}$, $\hat{r}_{ds}$, $\hat{r}_{gd}$ (in [Ω*mm]); $\hat{c}_{gs}$, $\hat{c}_{ds}$, $\hat{c}_{gd}$ (in [pF/mm]); $|\hat{g}_m|$ (in [mS/mm]); and τ in [ps] of a core model of the chain network ABC normalized to the size $P_{d,n}$ of the $n^{th}$ transistor device, where $\hat{r}_{gs}$, $\hat{r}_{ds}$, $\hat{r}_{gd}$, $\hat{c}_{gs}$, $\hat{c}_{ds}$, and $\hat{c}_{gd}$ are the resistance and capacitance of the device, respectively, normalized to the device periphery $P_d$, $|\hat{g}_m|$ is the transconductance in [mS/mm], and τ in [ps] is the drain-source delay time associated with the device transconductance;

(d) for each measured noise figure $F_{meas,n}$, de-embedding a noise contribution of the previously determined parasitic elements to obtain a noise contribution for each $n^{th}$ transistor device;

(e) for the at least three devices ABC, calculating the values of $A_n$, $B_n$, and $C_n$, where $A_n$, $B_n$ and $C_n$ for each device are functions of the device size $P_{d,n}$ resulting from transformations between a corresponding admittance Y representation of the device and a transmission T representation of the device;

(f) determining equivalent noise temperatures $t_{gs}$, $t_{ds}$, and $t_{gd}$ as a function of device size $P_d$ by solving the equation $$\frac{4N_i G_s(F_{meas,n}-1) - y_s^+ C_{T_A} y_s - y_s^+ T_{B,n} T_A C_{T_C} T_A^+ T_{B,n}^+ y_s}{4N_i P_{d_n}} =$$
$$A_n t_{ds} + B_n t_{gs} + C_n t_{gd}$$

where $N_i = kT_0 B$ where B is the bandwidth within which $N_i$ is considered, k=Boltzmann constant, $T_0$=290K, $G_S$ is a conductance of the source admittance $Y_S$, $y_s^+ = [Y_s\ 1]$, $C_T$ and T are correlation and transmission matrices, respectively of the network elements A, B, and C; and (g) determining actual noise temperatures $T_{gs}$, $T_{ds}$, and $T_{gd}$ associated with resistances $R_{gs}$, $R_{ds}$, and $R_{gd}$ of $n^{th}$ transistor device, where $T_{gs}=t_{gs}*T_0$, $T_{ds}=t_{ds}*T_0$, and $T_{gd}=t_{gd}*T_0$.

2. The method according to claim 1, further comprising evaluating a noise contribution of each of network elements A and C, finding the noise contribution of each of network elements to be negligible such that $C_{T_A}$ and $C_{T_C}$ can be disregarded, and solving the equation $$\frac{(F_{meas,n}-1)G_s}{P_{d_n}} = A_n t_{ds} + B_n t_{gs} + C_n t_{gd}.$$

* * * * *